United States Patent [19]
Chiang et al.

[11] Patent Number: 6,034,425
[45] Date of Patent: Mar. 7, 2000

[54] FLAT MULTIPLE-CHIP MODULE MICRO BALL GRID ARRAY PACKAGING

[75] Inventors: Kuo-Ning Chiang, Tao-Yen; Wen-Hwa Chen, Hsin-Chu; Kuo-Tai Tseng, Kao-Hsiang, all of Taiwan

[73] Assignee: ChipMOS Technologies Inc., Hsin-Chu, Taiwan

[21] Appl. No.: 09/270,802

[22] Filed: Mar. 17, 1999

[51] Int. Cl.[7] .................................................. H01L 23/48
[52] U.S. Cl. ......................... 257/697; 257/706; 257/707; 257/708; 257/727; 257/738; 257/778; 257/780; 257/790; 438/122
[58] Field of Search ..................................... 257/708, 738, 257/778, 780, 777, 706, 707, 727, 796; 438/122

[56] References Cited

U.S. PATENT DOCUMENTS

| | | | |
|---|---|---|---|
| 4,705,606 | 11/1987 | Young et al. ............................... | 204/15 |
| 5,604,978 | 2/1997 | Sherif et al. ............................... | 257/707 |
| 5,717,245 | 2/1998 | Pedder ...................................... | 257/691 |
| 5,729,051 | 3/1998 | Nakamura ................................. | 257/668 |
| 5,777,391 | 7/1998 | Nakamura et al. ....................... | 257/778 |
| 5,783,870 | 7/1998 | Mostafazadet et al. ................. | 257/791 |
| 5,796,321 | 8/1998 | Caillat et al. ............................. | 333/246 |
| 5,869,894 | 2/1999 | Degani et al. ............................ | 257/723 |
| 5,894,410 | 4/1999 | Barrow ..................................... | 361/760 |
| 5,900,675 | 5/1999 | Appelt et al. ............................. | 257/778 |
| 5,914,531 | 7/1999 | Tsunoda et al. .......................... | 257/668 |
| 5,914,535 | 7/1999 | Brandenburgh .......................... | 257/777 |
| 5,920,117 | 7/1999 | Sono et al. ............................... | 257/675 |
| 5,926,696 | 7/1999 | Baxter et al. ............................. | 438/118 |

Primary Examiner—Mahshid Saadat
Assistant Examiner—Edgardo Ortiz
Attorney, Agent, or Firm—H. C. Lin Patent Agent

[57] ABSTRACT

A micro ball grid array package is devised for a multiple-chip module (MCM). The IC chips in the package are butted together to save space. The bonding pads for the lower IC chip or chips are placed along the edges not butted with one another. The bonding pads of the chips are wire-bonded to a printed wiring plate, which has via holes through the printed wiring plate for connection to the ball grid array at the other side of the printed wiring plate and for surface mounting to a printed circuit board. A heat dissipating plate may be placed at the top of the IC chips away from the ball grid array.

10 Claims, 6 Drawing Sheets

FLAT MULTIPLE-CHIP MODULE MICRO BALL GRID ARRAY PACKAGING

INTRODUCTION

This invention relates to integrated circuit packaging—in particular to multiple-chip module packaging.

As memory capacity of an integrated circuit chip increases from 4M, 16MK 64M, 128M to 256 M, the manufacturing difficulty also increases and the manufacturing yield decreases. Another approach in increasing the memory capacity is to increase the packaging technique. For instance, a 128M memory can be obtained by packaging two 64M chips in one package, known as Multiple-chip Module (MCM). In this manner, the yield can be increased and the manufacturing difficulty can be reduced.

When the number of bonding pads of an IC is large, a popular packaging technique is the mirco Ball Grid Array ($\mu$BGA), where the bonding pads of an IC are fed through an insulating substrate via plated through holes to an array of soldering balls for bonding to a motherboard. While the $\mu$BGA package has been used for single chip IC, such an approach has not been used for MCM packages.

FIG. 1A shows a conventional single chip using a $\mu$BGA package. An IC chip 10 having bonding pads 12 along the edges connected to a printed circuit board 14 (printed wiring not shown) with bonding wires 16. The printed circuit board 14 has vias through which the terminals of the IC are fed to the ball grid array 18 serving as extensions for the IC terminals as shown in FIG. 1C. The IC chip 10 and the printed wiring plate are separated by a resin 15 which serves a cushion to reduce any stress due to difference in thermal expansion of the IC chip 10 and the printed circuit board 14 and to increase the reliability of the package.

The bonding pad arrangement shown in FIGS. 1A, 1B and 1C is not economical for a MCM, because space must be allowed between adjacent IC chips to run interconnections for the chips. When space is allowed between adjacent IC chips, the overall package size of an MCM is increased, as is the cost.

SUMMARY

An object of this invention is to minimize the package size of a $\mu$BGA MCM package. Another object of this invention is to increase the yield of producing MCM. Still another object of the present invention is to increase the heat dissipation of a MCM. A further object of this invention is to reduce moisture absorption of a MCM package.

These objects are achieved by butting the IC chips of a MCM horizontally and rearranging the design of the bonding pads in the IC chips. The adjacent IC chips can share a common printed circuit substrate, through which the terminals of the IC chips are fed to an array of soldering ball grids for surface mounting on a printed circuit board.

DETAILED DESCRIPTION OF THE PREFERRED EMBODIMENT

Figure 2A:
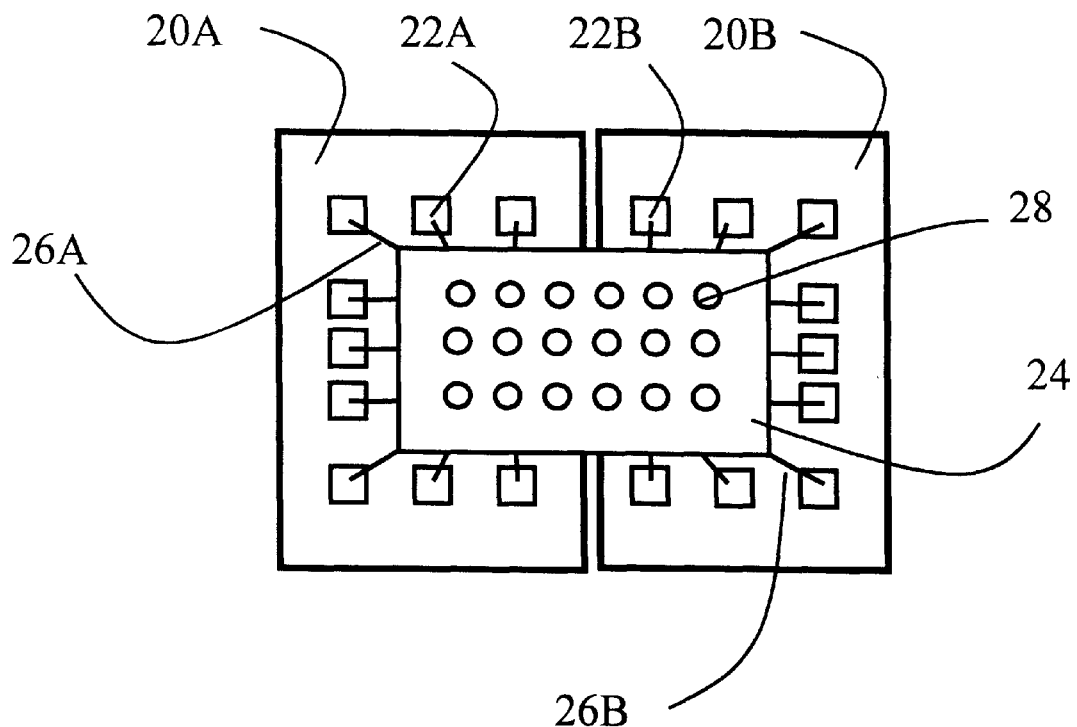
FIG. 2A shows the bonding pad arrangement of a two-chip MCM in a $\mu$BGA package.

FIG. 2A shows the bonding pad arrangement of a two-chip MCM in a BGA package based on the present invention. Two IC chips 20A and 20B are butted against each other. The bonding pads 22A, 22B for the two IC chips are aligned along the three non-butting sides of the corresponding IC chips 20A and 20B respectively. When so arranged, no space is needed between the butting IC chips, i.e. between chips 20A and 20B, because no space is needed to ran interconnections where there is no bonding pad nearby. The bonding pads 22A and 22B are wire bonded through bonding wires 26A and 26B respectively to a printed circuit plate 24 which has via holes to form a ball-grid array 28 on the opposite side of the plated wiring plate 24.

Figure 1A:
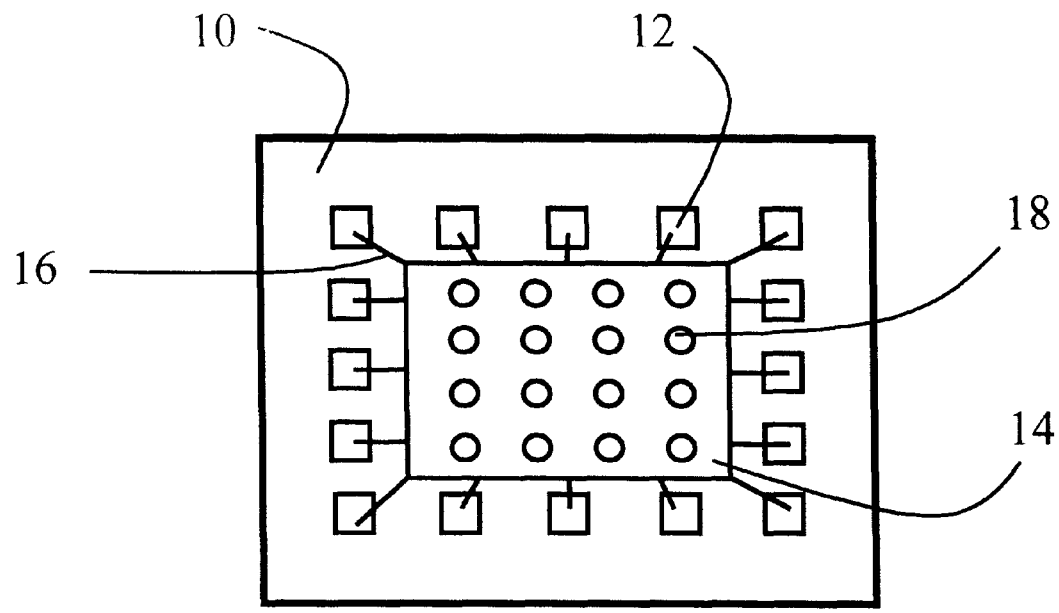
FIG. 1A shows the bonding pads of an IC chip for a conventional $\mu$BGA package having bonding pads along all four sides of an IC chip.
Figure 1B:
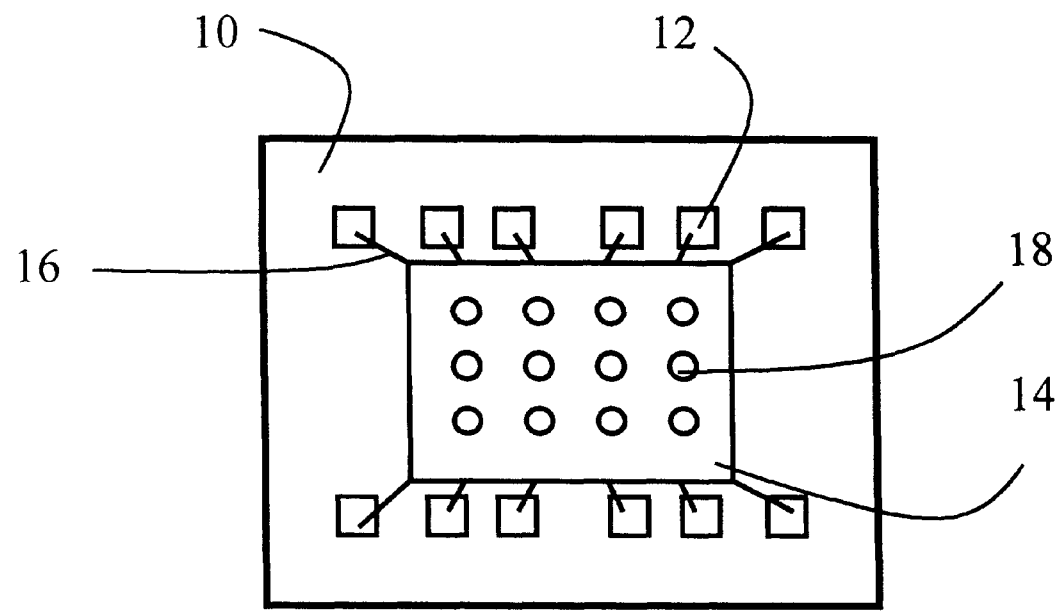
FIG. 1B shows another arrangement of bonding pads of an IC chip for a conventional $\mu$BGA package along two sides of the IC chip.
Figure 1C:
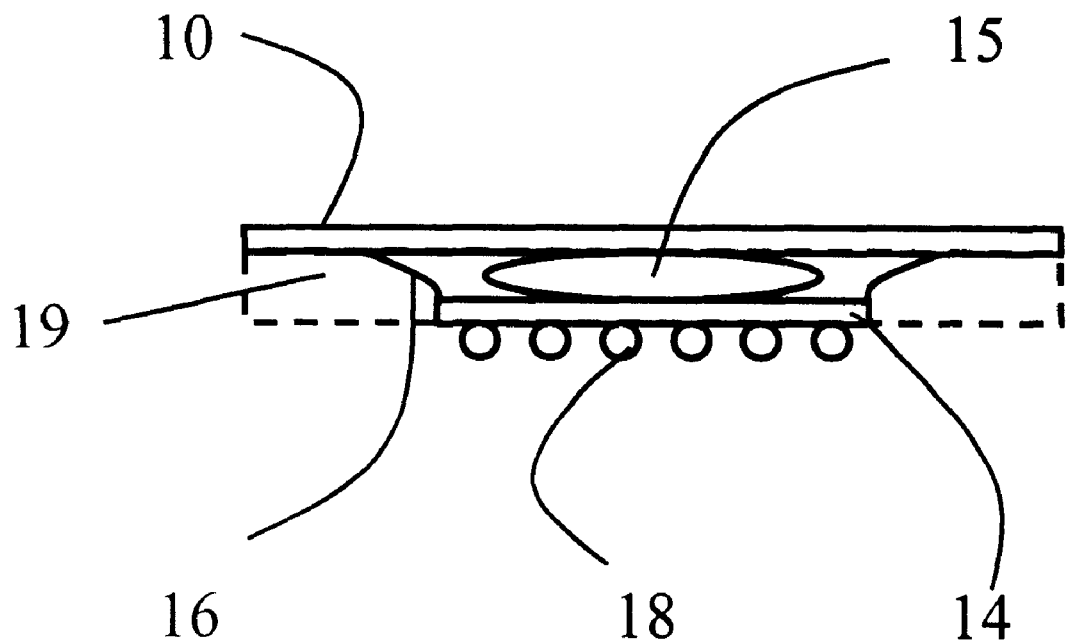
FIG. 1C shows a side view of the $\mu$BGA package shown in FIGS. 1A, 1B.
Figure 2B:
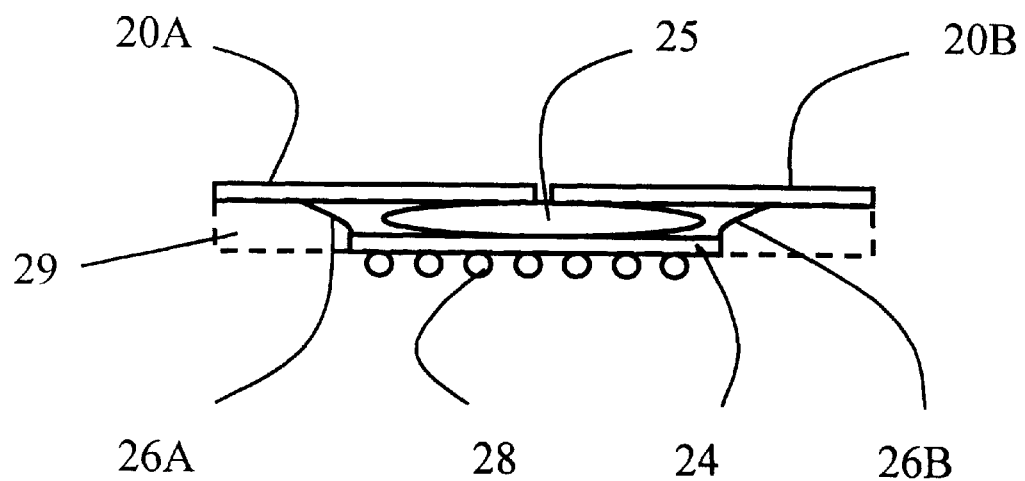
FIG. 2B shows the side view of the structure of FIG. 2A.

FIG. 2B shows the side view of the structure. The printed wiring plate 24 has through holes for connection to the other side of a ball grid array 28. The IC chips 20A and 20B butted together side by side and are separated from the plated wiring plate 24 by a resin cushion 25 to reduce thermal and mechanical stress similar to the cushion 15 shown in FIG. 1C. The bonding wires 26A between the chip 20A and the printed wiring plate 24, as well as the bonding wires 26B between the chip 20B and the printed wiring plate 24, are imbedded in a seal 29.

Figure 2C:
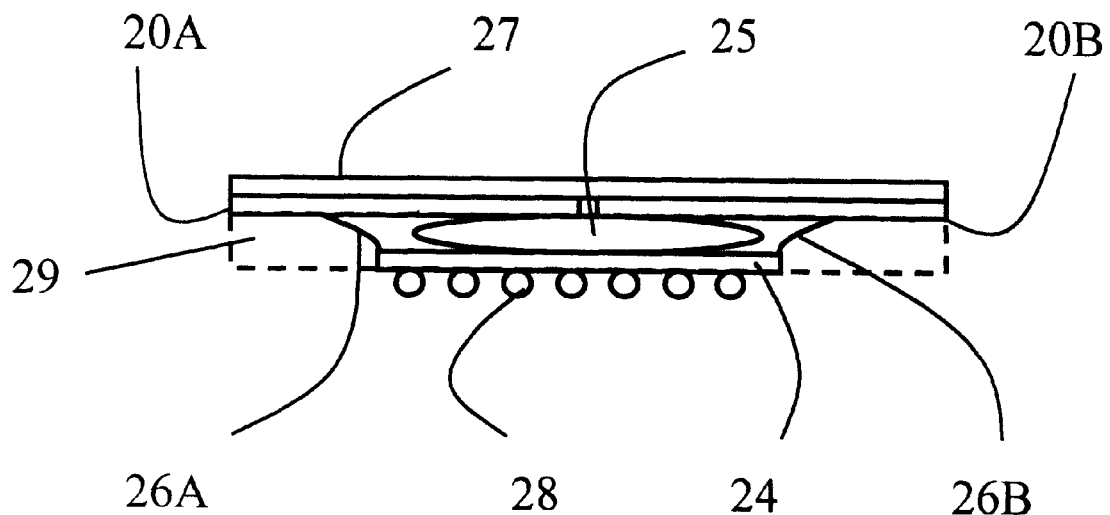
FIG. 2C shows the side view of the structure shown in FIG. 2A having a heat sink.

FIG. 2C shows the structure shown in FIG. 2B covered by s heat sink 27, which can be metal or non-metal. The entire structure is sealed in glue 29 to protect the MCM against shock and moisture.

Figure 3:
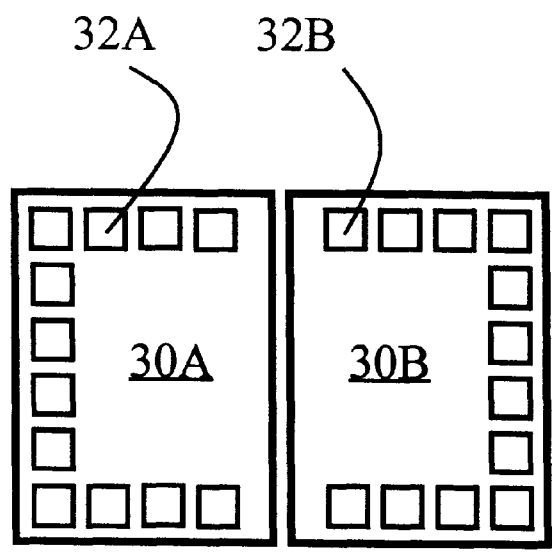
FIG. 3 shows the bonding pad arrangement of a butted two-chip MCM in a $\mu$BGA package, each chip having bonding pads aligned along three sides.

FIG. 3 shows a bonding pad arrangement of the two-chip MCM. The first chip 30A has bonding pads 32A aligned all three sides other than the butting edge, as has chip 30B having the bonding pads 32B aligned three sides.

Figure 4:
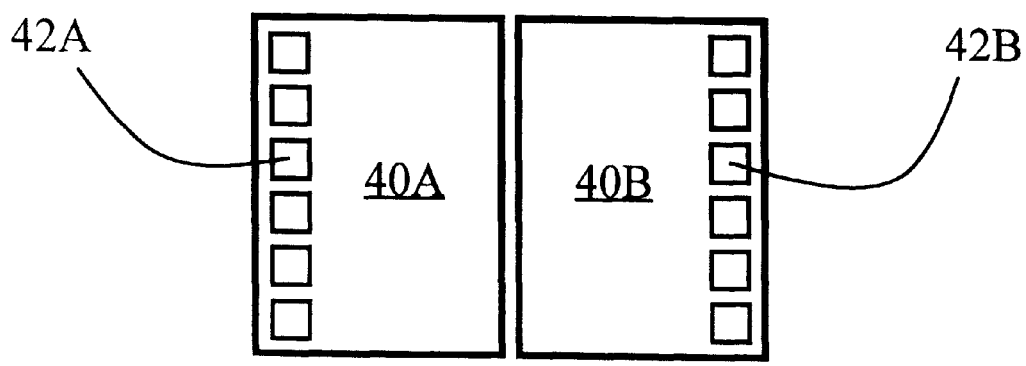
FIG. 4 shows the bonding pad arrangement of a butted two-chip MCM in a $\mu$BGA package, each chip having bonding pads aligned along only one side.

FIG. 4 shows another bonding pad arrangement of a two-chip MCM. The bonding pads 42A of chip 40A and the bonding pads 42B if chip 40B are aligned only on one side of each chip opposite to the butting side of the two chips.

Figure 5:
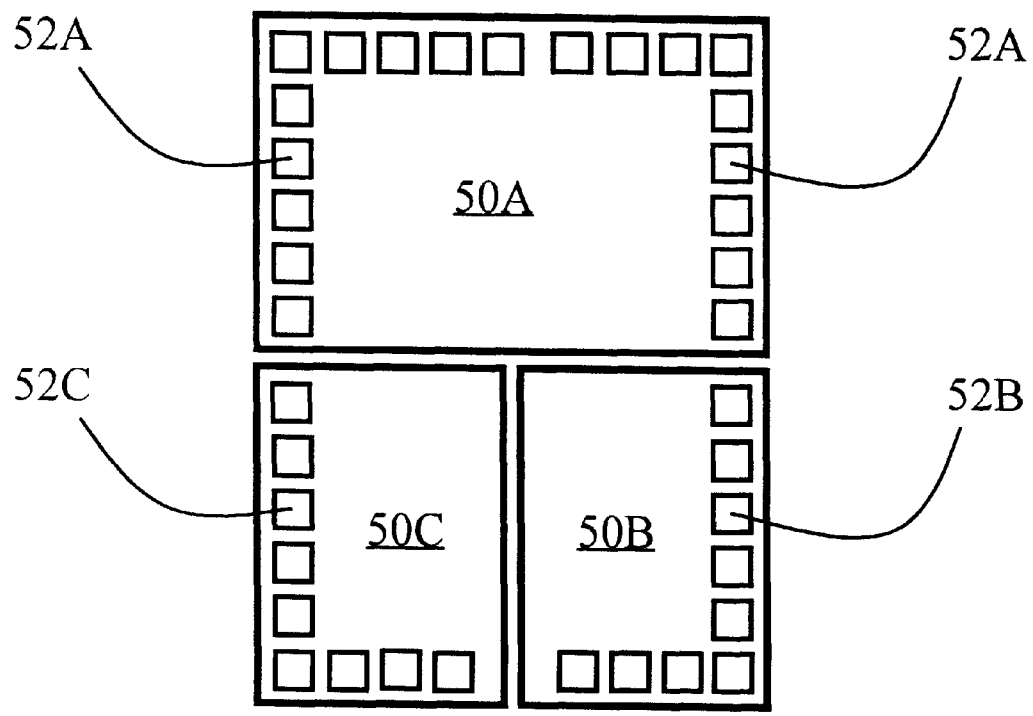
FIG. 5 shows the bonding pad arrangement of a three-chip MCM in a $\mu$BGA package.

FIG. 5 shows the bonding pad arrangement of a three chip MCM. A larger IC chip 50A is butted against two smaller IC chips 50B and 50C, which are also butted against each other. The bonding pads are aligned along the sides which are not butted. Thus the larger chip 50A has bonding pads 52A aligned three sides. The smaller chips 50B and 50C have bonding pads 52B and 52C aligned only along two sides of the respective IC chips 50B and 50C.

Figure 6:
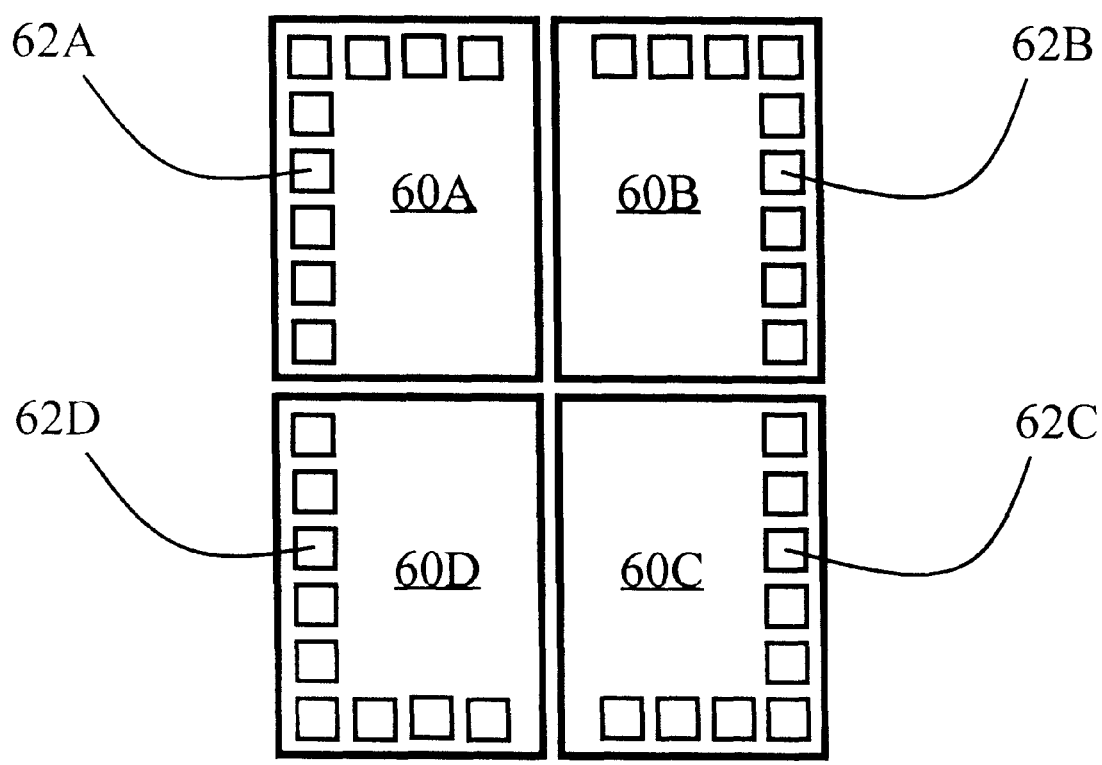
FIG. 6 shows the bonding pad arrangement of a four-chip MCM in a $\mu$BGA package.

FIG. 6 shows the bonding pad arrangement of a four-chip MCM. The four chips are butted against one another, i.e. chip 60A against chips 60B and 60D, chip 60B against chips 60A and 60C, chip 60C against chips 60B and 60D; chip 60D against chips 60A and 60C. As in FIG. 2A, the bonding pads 62A, 62B, 62C and 62D of the four chips are placed along two non-butting sides of respective chips. Thus, all the bonding pads lie along the overall edges of the stacked structure, which can then be fed to a μBDA through a printed wiring plate such as that shown in FIG. 2C.

While the preferred embodiments have been shown and described, it will be apparent to those skilled in the art that various modifications may be made in the embodiments without departing from the spirit of the present invention. Such modifications are all within the scope of this invention.

What is claimed is:

1. A ball grid array (BGA) package for a multiple chip module (MCM), comprising:
    at least two integrated circuit (IC) chips butting against one another;
    bonding pads of said IC chips placed along edges of adjacent said IC chips not facing each other;
    a printed wiring plate having a first side connected to said bonding pads and having through holes connected to a second side with said BGA.

2. A BGA package as described in claim 1, wherein there are two said IC chips.

3. A BGA package as described in claim 2, wherein the bonding pads are aligned along sides of said IC chips not butting against each other.

4. A BGA package as described in claim 2 wherein the bonding pads are aligned along two opposite sides of said two IC chips in parallel with the common butting edge of said two IC chips.

5. A BGA package as described in claim 1, wherein there are three said IC chips,
    one of said IC chips being larger in chip size than two other said IC chips; and
    butting along one edge against said two other said IC chips, which also butt against each other.

6. A BGA package as described in claim 5, wherein the bonding pads are aligned along four sides of said three IC chips not butting against one another.

7. A BGA package as described in claim 1, wherein said IC chips are separated from said printed wiring plate by a cushion.

8. A BGA package as described in claim 7, wherein said cushion is a resin.

9. A BGA package as described in claim 7, wherein said package is sealed in a glue.

10. A BGA package as described in claim 1, further comprising a heat dissipating plate contacting the surface of said IC chips away from the surface where said IC chips are wire bonded to the printed wiring plate.

* * * * *